United States Patent
Kuo et al.

(10) Patent No.: US 8,882,329 B2
(45) Date of Patent: Nov. 11, 2014

(54) HILLOCK FOR FIXING PCB ON BACKPLANE, BACKPLANE AND BACKLIGHT MODULE

(75) Inventors: Yicheng Kuo, Shenzhen (CN); Yuchun Hsiao, Shenzhen (CN); Chong Huang, Shenzhen (CN); Jiahe Cheng, Shenzhen (CN); Chengwen Que, Shenzhen (CN); Quan Li, Shenzhen (CN); Liuyang Yang, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 474 days.

(21) Appl. No.: 13/375,872

(22) PCT Filed: Nov. 30, 2011

(86) PCT No.: PCT/CN2011/083248
§ 371 (c)(1),
(2), (4) Date: Dec. 2, 2011

(87) PCT Pub. No.: WO2013/071652
PCT Pub. Date: May 23, 2013

(65) Prior Publication Data
US 2013/0128498 A1  May 23, 2013

(30) Foreign Application Priority Data

Nov. 18, 2011 (CN) .......................... 2011 1 0389270

(51) Int. Cl.
| *F21V 7/04* | (2006.01) |
| *G09F 13/04* | (2006.01) |
| *H05K 5/02* | (2006.01) |
| *H05K 7/00* | (2006.01) |
| *H05K 7/14* | (2006.01) |
| *H04N 5/64* | (2006.01) |

(52) U.S. Cl.
CPC *G09F 13/04* (2013.01); *H05K 5/02* (2013.01); *H05K 7/00* (2013.01); *H05K 7/142* (2013.01); *G09F 13/0413* (2013.01); *H04N 5/64* (2013.01)
USPC .......................................... 362/631; 361/788

(58) Field of Classification Search
USPC ...................... 174/138 G; 361/742, 758, 788; 362/631–633
See application file for complete search history.

(56) References Cited

U.S. PATENT DOCUMENTS

| 4,167,772 A * | 9/1979 | Baehne .......................... 361/758 |
| 6,377,445 B1 * | 4/2002 | Davis et al. ............... 174/138 G |

(Continued)

FOREIGN PATENT DOCUMENTS

| CN | 2519320 Y | 10/2002 |
| CN | 2526976 Y | 12/2002 |

(Continued)

OTHER PUBLICATIONS

Zhang Zhongqing, the first office action, Oct. 2012, CN.

(Continued)

*Primary Examiner* — Stephen F Husar
(74) *Attorney, Agent, or Firm* — IPro, Inc.; Na Xu (57) ABSTRACT

The present invention discloses a hillock for fixing PCB on backplane, a backplane and a backlight module. A hillock is used for fixing PCB on backplane; the hillock is provided with a PCB mounting hole for fixing the PCB; the bottom of the hillock is provided with a fixed structure for arranging the hillock on the backplane. In the present invention, because each hillock on the backplane is designed into an independent part, and the hillock is fixed on the backplane by a fixed structure at the bottom of the hillock, hillocks of corresponding positions and corresponding number are arranged on the backplane in accordance with different requirement, such as PCBs of different size, and requirements of components of different number. Thus, there is no need for production of backplanes of various specifications to adapt for the requirements of various PCBs and the like and components of different number, and only a kind of backplane is required to be produced. The production cost of backplanes is saved, and the generality of backplanes is improved.

1 Claim, 11 Drawing Sheets

(56) References Cited

U.S. PATENT DOCUMENTS

2007/0002580 A1    1/2007    Ahn et al.
2010/0246147 A1*    9/2010    Qin et al. .................. 361/758

FOREIGN PATENT DOCUMENTS

| | | |
|---|---|---|
| CN | 201307377 Y | 9/2009 |
| CN | 201672468 U | 12/2010 |
| CN | 102141222 A | 3/2012 |
| CN | 102392995 A | 3/2012 |
| CN | 102392999 A | 3/2012 |
| CN | 202328048 U | 7/2012 |
| JP | 2007026916 A | 2/2007 |

OTHER PUBLICATIONS

Yang Yan, the International Searching Authority written comments, Aug. 2012, CN.

Zhang Zhongqing, the second office action, Jun. 2013, CN.

* cited by examiner

HILLOCK FOR FIXING PCB ON BACKPLANE, BACKPLANE AND BACKLIGHT MODULE

TECHNICAL FIELD

The present invention relates to the field of liquid crystal displays (LCDs), and more particularly to a hillock for fixing PCB on backplane, a backplane and a backlight module.

BACKGROUND

In a backlight module, most components are arranged and fixed on a backplane. For example, a printed circuit board (PCB) is fixed on the backplane by the hillock(s) on the backplane.

Figure 1:
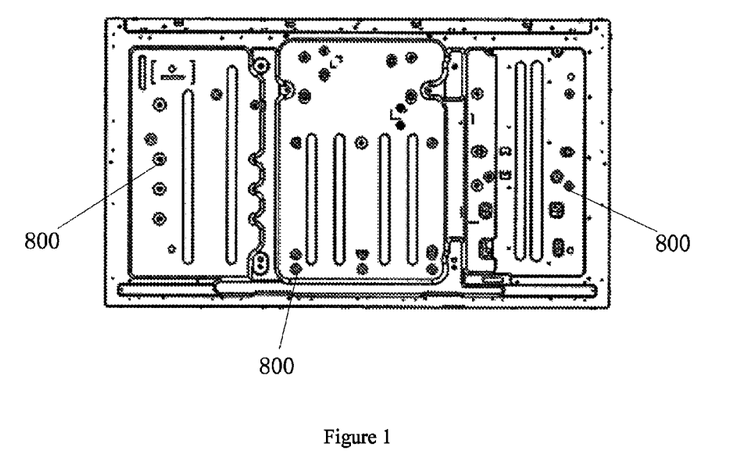
FIG. 1 is a simplified structure diagram of an existing backplane.

Hillock is a structure which is arranged on the backplane and is used for fixing the PCB and the like. In general, the hillock protrudes from the backplane surface, and the PCB is fixed on the hillock by screws or other locking pieces; and then the short circuit caused by direct contact between the PCB and the backplane surface is avoided. An existing backplane is as shown in FIG. 1, and the hillocks 80 on the backplane are integrally stamped and formed on the backplane when the backplane is made. Thus, the positions of the hillocks 80 on the backplane are fixed so it is difficult to adapt for the PCBs of different size; meanwhile, for the backlight modules requiring PCBs of different size and components of different number, corresponding backplanes are required to be mold-made; and for PCBs of different size, new backplanes are required to be mold-made. Thus, the generality of backplanes is poor, and the production cost is high under the condition.

SUMMARY

The aim of the present invention is to provide a hillock, which is used for fixing PCB on backplane and has the advantages of independent use and good generality, a backplane and a backlight module.

The purpose of the present invention is achieved by the following technical schemes. A hillock for fixing PCB on backplane; the hillock is provided with a PCB mounting hole for fixing the PCB; and the bottom of the hillock is provided with a fixed structure for arranging the hillock on the backplane.

Preferably, the fixed structure is a threaded hole arranged at the bottom of the hillock. The hillock can be conveniently arranged on the backplane by screw(s), and can be removed.

Preferably, the threaded hole penetrates through the hillock. Thus, the PCB, the hillock and the backplane can be mutually fixed by only one screw; the three components are fixed because the screw passes through the PCB, the hillock and the backplane and the screw is tightly locked by a nut.

Preferably, the fixed structure is a rivet integrally arranged at the bottom of the hillock. The riveting mode has the advantages of simplicity, convenience, quickness and high reliability, and can be accomplished by machinery.

Preferably, the hillock is of a conical structure with trapezoidal section. The conical structure is preferable to lock the PCB.

Preferably, a backplane, which is provided with the aforementioned hillock mounting hole.

A backlight module comprises a backplane, a PCB and hillock(s); the hillock is provided with a PCB mounting hole for fixing the PCB, and the bottom of the hillock is provided with a fixed structure for arranging the hillock on the backplane; the backplane is provided with a hillock mounting hole for fixing the hillock; the hillock is arranged on the backplane by the hillock mounting hole, and the PCB is fixed on the hillock.

Preferably, the bottom of the hillock is fixed on the backplane by one screw, and the PCB is fixed on the hillock by the other screw. The hillock can be conveniently arranged on the backplane by one screw, and can be removed; the PCB is arranged on the hillock by the other screw. Thus, the PCB is locked on the backplane.

Preferably, the hillock is provided with a threaded hole which penetrates through the hillock, and the PCB and the hillock are fixed on the backplane by one screw. Thus, the PCB, the hillock and the backplane are mutually fixed by only one screw; the three components are fixed because the screw passes through the PCB, the hillock and the backplane and the screw is locked by a nut.

Preferably, the hillock is riveted on the backplane by a rivet at the bottom of the hillock, and the PCB is fixed on the hillock by a screw. The riveting mode has the advantages of simplicity, convenience, quickness and high reliability, and can be accomplished by machinery.

In the present invention, because the hillock on the backplane is designed as an independent part, and the hillock is fixed on the backplane by the fixed structure at the bottom of the hillock, hillocks of corresponding positions and corresponding number are arranged on the backplane in accordance with different requirement, such as PCBs of different size, and requirements of components of different number. Thus, backplanes of various specifications are produced to adapt for the requirements of various PCBs and the like and components of different number is avoided, and only a kind of backplane is required to be produced. Thus, the production cost of backplanes is saved, and the generality of backplanes is improved.

Wherein: 1. backplane; 100. frame; 111. upper bracket; 112. right bracket; 113. lower bracket; 114. left bracket; 115. central bracket; 120. bridge; 121. chute; 122; through hole; 124. end hinge; 125. tail hinge; 126. cross groove; 127. connecting groove; 800. hillock; 810. threaded hole; 811. screw; 812. nut; 820. rivet; 300. PCB.

DETAILED DESCRIPTION

An embodiment of the present invention provides an LCD device, comprising an LCD panel and a backlight module. The bottom of the backlight module is provided with a backplane. The backplane is provided with independent hillock(s) for locking a PCB and the like, and the hillock is provided with a PCB mounting hole for fixing the PCB; the bottom of the hillock is provided with a fixed structure for arranging the hillock on the backplane.

The present invention will further be described in detail in accordance with the following preferred embodiments.

Embodiment 1

In a backlight module, most components are arranged and fixed on a backplane. For example, a PCB is fixed on the backplane by the hillock(s) on the backplane.

Figure 2:
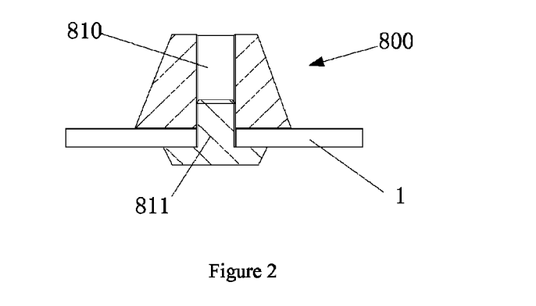
FIG. 2 is a simplified structure diagram of one hillock of embodiment 1 of the present invention.
Figure 4:
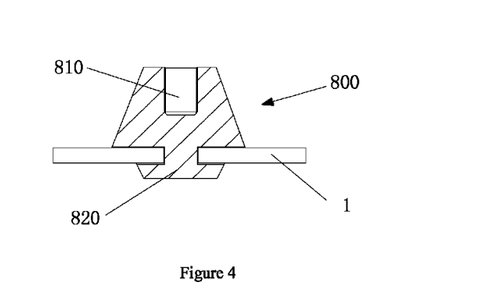
FIG. 4 is a simplified structure diagram of the other hillock of embodiment 1 of the present invention.

FIG. 2 and FIG. 4 show a hillock 800 existing as an independent part; the hillock is not formed on the backplane when the backplane is manufactured, but the hillock 800 is arranged in the corresponding position of the backplane 1 to achieve the aim of positioning the PCB and the like of different size by flexibly using the hillock 800.

Figure 3:
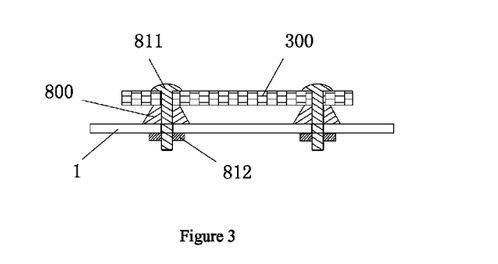
FIG. 3 is one structure diagram of a PCB locked by a hillock of embodiment 1 of the present invention.

As shown in FIG. 2, the hillock 800 has a PCB mounting hole (namely a threaded hole 810) for arranging and fixing the PCB and the like, and the threaded hole 810 penetrates through the independent hillock 800. Thus, the independent hillock 800 can be fixed on the backplane 1 from the lower part through a screw 811, and can fix the PCB from the upper part. Accordingly, the backplane 1 is provided with hillock mounting holes, such as through holes or chutes, of which the size is corresponding to that of the threaded hole 810 of each hillock 800, so that the hillock 800 can be fixed on the backplane 1. Similarly, the PCB, the hillock and the backplane are fixed by using only one screw matching with a nut. As shown in FIG. 3, because the threaded hole penetrates through the whole hillock 800, the PCB 300 is directly locked on the backplane 1 by a screw 811 matching with a nut 812.

Figure 5:
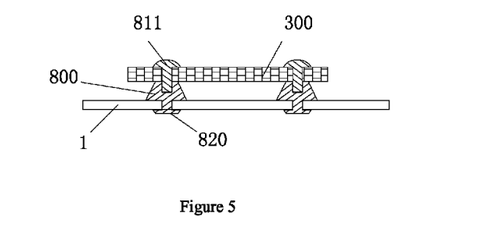
FIG. 5 is the structure diagram of a PCB locked by another hillock of embodiment 1 of the present invention.

In order to facilitate installation, as shown in FIG. 4, the bottom of the hillock is designed into a structure similar to a rivet, namely the rivet and the hillock are integrally formed. The lower end of the hillock 800 is connected with the backplane 1 by riveting, namely the hillock 800 is riveted on the backplane 1 by a rivet 820. The riveting mode is quicker than the screwing mode, and can be accomplished by machinery so that the production efficiency can be increased. As shown in FIG. 5, the hillock 800 is fixed on the backplane 1 by a rivet 820, and then the PCB 300 is fixed on the hillock by a screw 811 so that the PCB 300 is locked.

Figure 6:
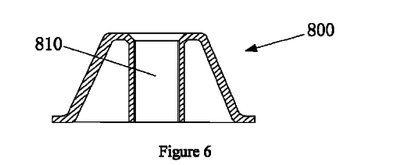
FIG. 6 is a simplified structure diagram of a third hillock of embodiment 1 of the present invention.

To save material and facilitate processing, the hillock can be formed by directly stamping a panel; as shown in FIG. 6, the inside of the hillock 800 is of a hollow structure, and the whole hillock 800 is made of panel material, which saves the material and facilitates the production.

Of course, the shape of the independent hillock 800 in the embodiment is not limited to the conical section shape shown in the figure; other shape such as square can also achieve the corresponding purpose.

In the embodiment, corresponding hillocks are arranged in corresponding positions in accordance with the PCB size of the backlight module; meanwhile, hillocks of corresponding number are arranged in accordance with different number of PCB components.

Embodiment 2

Figure 7:
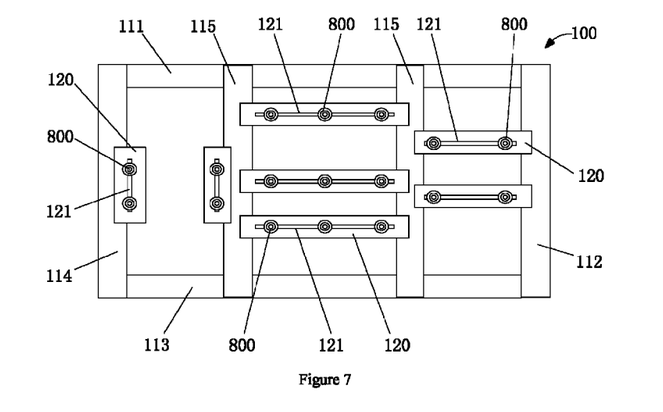
FIG. 7 is a simplified structure diagram of a backplane of embodiment 2 of the present invention.
Figure 8:
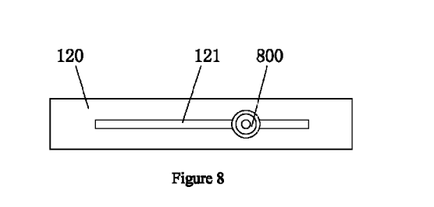
FIG. 8 is a simplified structure diagram of a bridge of embodiment 2 of the present invention.

A frame type backplane is shown in FIG. 2. The backplane is combined into a main frame 100 by multiple brackets and is combined and fixed on the brackets by matching with corresponding bridges 120; the brackets and the bridges are correspondingly provided with hillocks 800 required for fixing PCB and the like. In the embodiment, the hillocks 800 are hillocks existing as independent parts in embodiment 1. As shown in FIG. 7, the main frame 100 of the frame type backplane is provided with multiple bridges 120; each bridge 120 is provided with a chute 121 (FIG. 8 shows the condition of one bridge provided with a hillock); the hillock 800 is arranged in the chute 121; and the hillock 800 is arranged in the same mode as that of embodiment 1 and is fixed by a screw or an integrally formed rivet at the bottom of the hillock 800. Of course, the hillock 800 can be fixed by other modes as well besides the two modes of example 1. The hillock 800 is arranged in the corresponding position in the chute 121 in accordance with PCBs of different size and specifications. Thus, the PCB of the size is locked.

In order to facilitate installation, the hillock is arranged in the chute in advance by a screw, but the screw is not tightly locked so that the hillock can be slid in the chute. The hillock is slid in the corresponding position in accordance with the PCB size, and the screw is tightly locked after locking the PCB. Alternatively, the hillock is directly fixed by a screw or a rivet in accordance with the PCB size, and then the PCB is locked to reduce process.

In the embodiment, the chute can be arranged in the bracket as well, and then more positions for arranging hillocks can be provided, to meet the needs of some backlight modules with many components.

Embodiment 3

Figure 9:
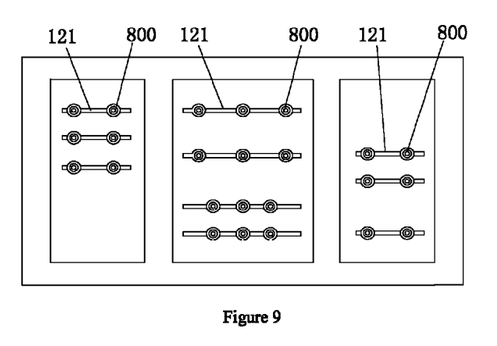
FIG. 9 is a simplified structure diagram of a backplane of embodiment 3 of the present invention.

FIG. 9 shows a backplane formed by processing an integral panel. The backplane surface is provided with chutes 121, and the length, the position and the number of the chutes 121 are correspondingly set on the backplane surface in accordance with PCBs of different size. Each chute 121 is provided with a hillock 800. In the embodiment, the hillock 800 is a hillock existing as an independent part in embodiment 1. The position of the hillock 800 is adjusted in accordance with the PCB size, and is adjusted within the chute 121. Thus, the backplanes of the type can be generally used in various backlight modules.

In order to facilitate installation, the hillock is arranged in the chute in advance, but the screw is not tightly locked so that the hillock can be slid in the chute. The hillock is slid in the corresponding position in accordance with the PCB size, and the screw is tightly locked after locking the PCB. Alternatively, the hillock is directly fixed by a screw or a rivet in accordance with the PCB size, and then the PCB is locked to reduce steps in processing.

Embodiment 4

Figure 10:
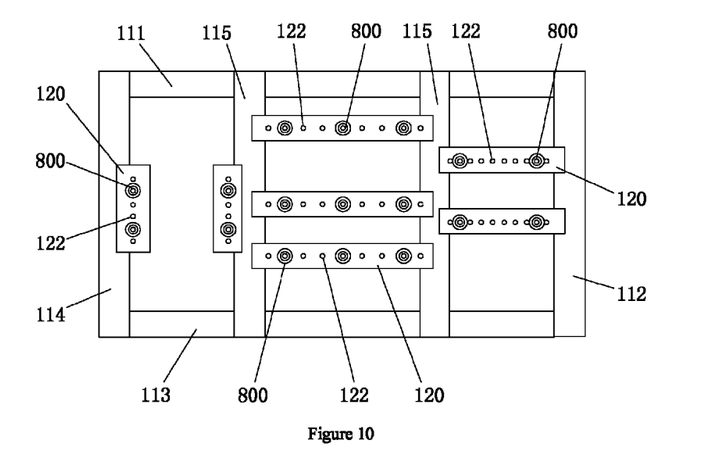
FIG. 10 is a simplified structure diagram of a backplane of embodiment 4 of the present invention.

FIG. 10 also shows a frame type backplane. The backplane is combined into a main frame 100 by multiple brackets and is combined and fixed on the brackets by matching with corresponding bridges 120, and the brackets and the bridges are correspondingly provided with hillocks 800 required for fixing the PCB and the like. In the embodiment, the hillocks 800 are hillocks existing as independent parts in embodiment 1. As shown in FIG. 10, the main frame 100 of the frame type backplane is provided with multiple bridges 120, and the bridges 120 are provided with multiple through holes 122. The through holes 122 are arranged in the corresponding positions of the bridges 120 in accordance with the size of frequently-used PCBs or other components; namely for the PCB of each size, the bridges 120 are provided with corresponding through holes 122; alternatively, the bridges 120 are provided with a series of evenly spaced standard holes. The standard holes cover the through holes required by PCBs of various specifications so as to facilitate processing. Each hillock 800 is arranged in a through hole 122. The hillock 800 is arranged in the same mode as that of embodiment 1, and is fixed by a screw or an integrally formed rivet at the bottom of the hillock 800. Of course, the hillock 800 can be fixed by other modes besides the two modes of the embodiment as well. The hillocks 800 are arranged in the corresponding through holes 122 in accordance with the PCBs of various size and specifications. Thus, the PCB of the size is locked on the backplane.

In the embodiment, each through hole can be arranged in the bracket as well, and then more positions for arranging hillocks can be provided, to meet the need of some backlight modules with many components.

Embodiment 5

Figure 11:
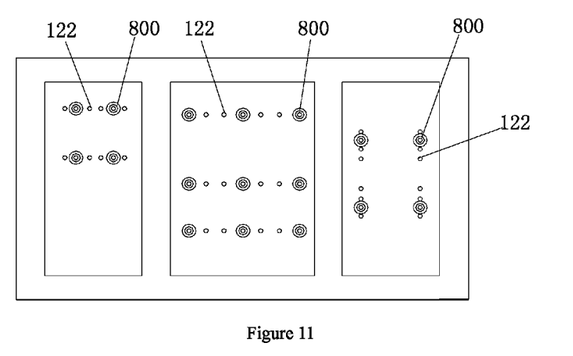
FIG. 11 is a simplified structure diagram of a backplane of embodiment 5 of the present invention.

In the embodiment, hillocks used on the backplane are hillocks of embodiment 1. FIG. 11 shows a backplane formed by processing an integral panel. The backplane surface is provided with through holes 122, and the through holes 122 are arranged in the corresponding positions of the backplane surface in accordance with the size of frequently-used PCBs or other components. Namely, for the PCB of each specification, the backplane surface is provided with multiple corresponding through holes 122, and the hillocks 800 are selectively fixed in the multiple through holes 122 as required. Because multiple holes are correspondingly arranged in accordance with the PCB size of various specifications, one backplane is adapted for PCBs of various size; some unnecessary holes are avoided, so that the strength of the backplane is not weakened; alternatively, the backplane surface is provided with a series of evenly spaced standard holes; the standard holes cover the through holes 122 required by PCBs of various specifications so as to facilitate processing, and the hillocks 800 are selectively fixed in the standard holes in accordance with PCBs of different size. Each hillock 800 existing as an independent part is arranged in a through hole 122. The hillocks 800 are arranged in corresponding through holes 122 in accordance with the PCBs of various size and specifications. Thus, the PCB of the size is locked on the backplane.

Embodiment 6

Figure 12:
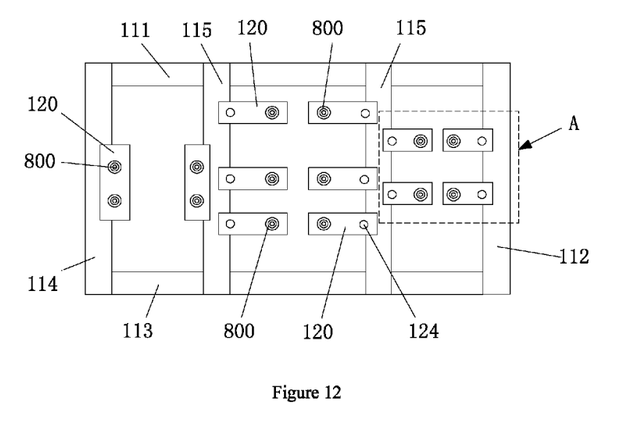
FIG. 12 is a simplified structure diagram of a backplane of embodiment 6 of the present invention.
Figure 13:
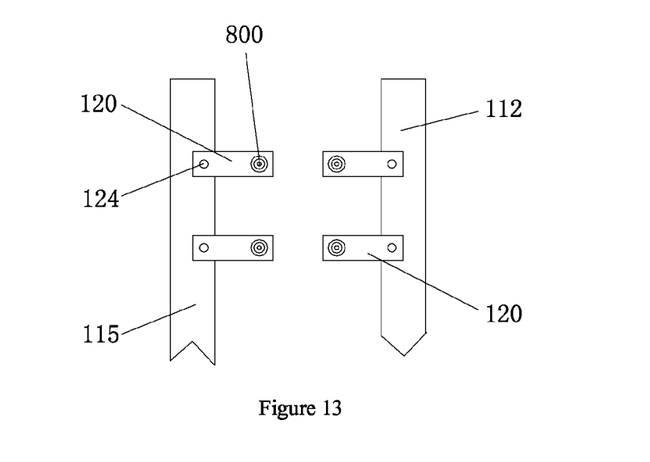
FIG. 13 is an enlarged view of A shown in FIG. 12.
Figure 14:
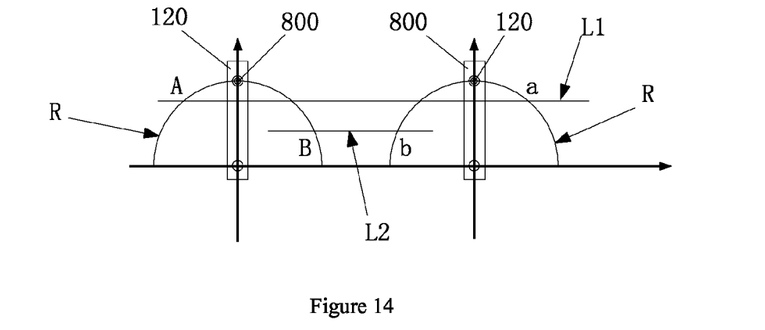
FIG. 14 is a track analysis diagram of the hillocks of embodiment 6.

In the embodiment, the used icons are hillocks of embodiment 1. FIG. 12 shows embodiment 4 of the present invention; A in the figure points to the arrangement of a rotation bridge, and FIG. 13 is an enlarged view of A. As shown in FIG. 14, the central brackets 115 and the right bracket 112 are provided with four bridges 120 in total arranged in opposite; the fixed ends of the bridges 120 are respectively connected with the central brackets 115 and the right bracket 112 through the end hinges 124; in this way, the bridges 120 can rotate relative to the fixed points of the bridges 120 to the brackets (i.e. the end hinges 124). FIG. 14 is a diagram of a running track of hillocks 800 on the two bridges 120 of the right bracket 112; in the figure, the circular arcs R indicate the running tracks of the hillocks 800; straight lines L1 and L2 refer to the connecting lines of the fixed points of PCBs of different size; as shown in the figure, the intersection points of the straight line L1 with the curves R are the positions of the fixed points A and a of one PCB; the intersection points of the straight line L2 with the curves R are the positions of the fixed points B and b of another PCB; namely, the locking positions of PCBs of two specifications in the positions of the fixed points A, a, B and b are provided in a rotatable track of the hillocks 800 on the bridges 120. Therefore, in the scheme, the running track of the corresponding hillocks 800 can be set according to the PCBs of different size, and the installation of multiple PCBs of different size can be satisfied, so as to improve the generality of the backplane.

Figure 15:
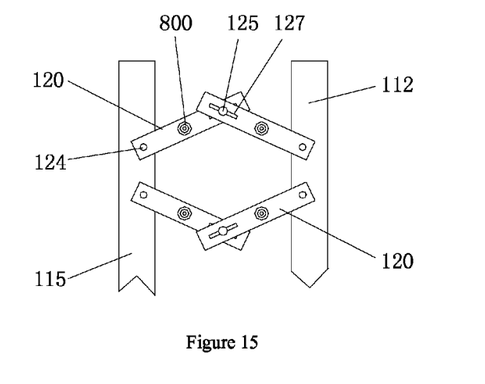
FIG. 15 is another structure form of embodiment 6 of the present invention.
Figure 16:
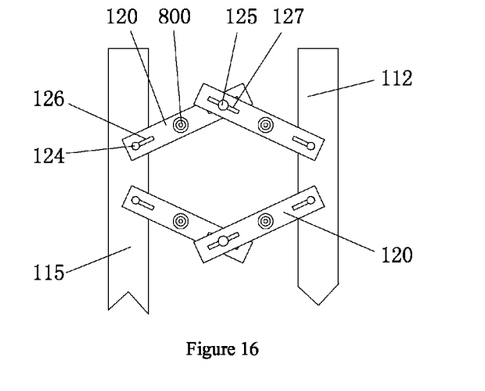
FIG. 16 is a third structure form of embodiment 6 of the present invention.

In addition, as shown in FIG. 15, to improve the supporting strength of the bridges 120, the free ends of two opposite bridges 120 are connected through tail hinges 125, and connecting grooves 127 are arranged in the connecting positions, so that the tail hinges 125 can slide on the connecting grooves without blocking the rotation of the bridges 120; correspondingly, as shown in FIG. 16, the fixed ends of the bridges 120 are also provided with cross grooves 126 so that the end hinges 124 can also slide in the cross grooves 126; in this way, the whole of bridges 120 can slide relative to the end hinges 124 so that the mobile track of the hillocks 800 on the bridges 120 is not limited to the track of the circular arc shown in FIG. 4 but is a larger region. Thus, the generality of backplanes is further improved.

In the embodiment, the hinge connection between the bridges and the brackets and the hinge connection between the bridges can be conducted through screws or rivets; the screws can be locked in the screwing mode after locking the PCB, and the stability of the screws can be improved; and the connecting reliability can be improved by using the rivets.

Embodiment 7

Figure 17:
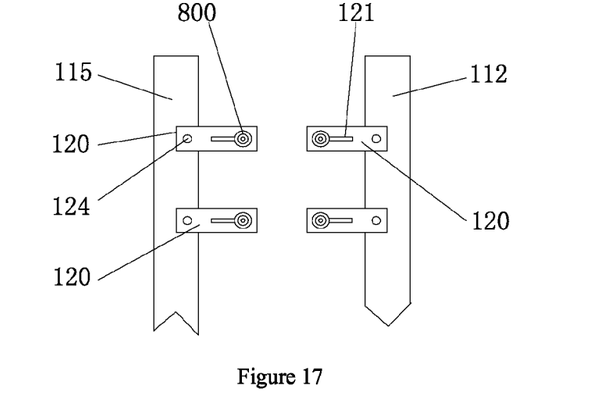
FIG. 17 is a structure form of embodiment 7 of the present invention.
Figure 18:
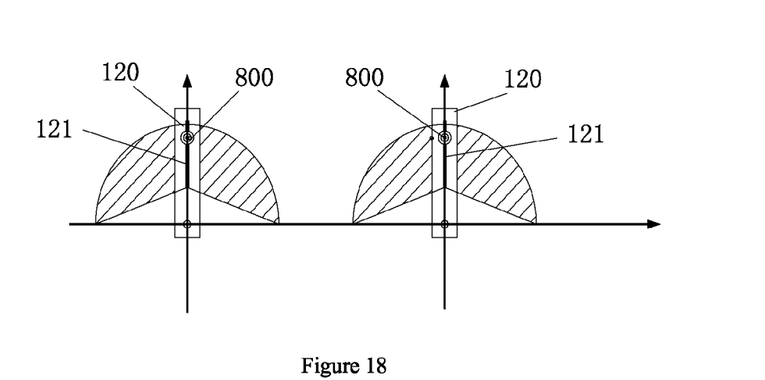
FIG. 18 is a track analysis diagram of the hillocks of embodiment 7 of the present invention.

In accordance with the scheme of embodiment 6, to obtain larger hillock mobile range, the bridges can be provided with chutes or through holes of embodiment 1 to embodiment 3, and can use hillocks existing as independent parts. As shown in FIG. 17, each selectable bridge 120 is provided with a chute 121, and the hillock 800 is arranged in the corresponding position of the chute 121 as required. FIG. 18 is an analysis diagram of the mobile positions of the hillocks 800, and the dashed areas shown in the figure (namely the gradient fill parts) are the mobile regions of the hillocks 800. Namely, after the chutes 121 are used, the mobile positions of the hillocks 800 are changed to the planar regions from the original circular arcs. Thus, the backplane can be adapted for more PCBs of different size.

Figure 19:
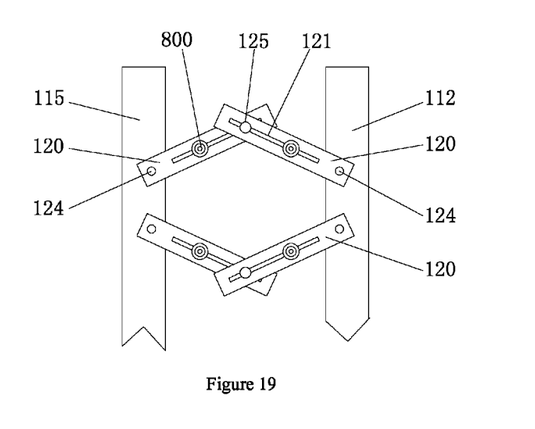
FIG. 19 is another structure form of embodiment 7 of the present invention.

Similarly, to improve the supporting strength of the bridges, the free ends of the bridges are connected, and connecting grooves are arranged so that the bridges still can rotate. As shown in FIG. 19, to facilitate processing, when the chutes 121 are processed, the length of the chutes 121 is extended so that the chutes 121 replace the connecting grooves for functions.

Figure 20:
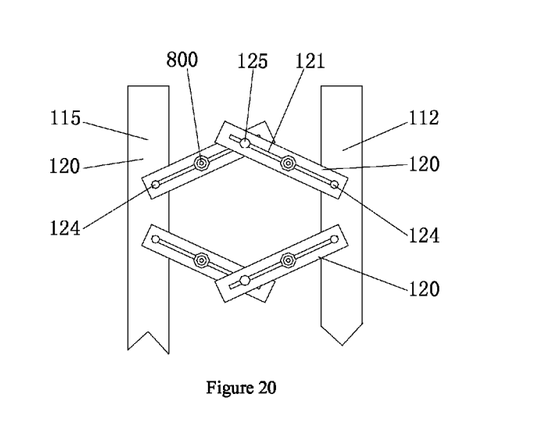
FIG. 20 is a third structure form of embodiment 7 of the present invention.

Of course, the chutes 121 can replace the cross grooves for functions of embodiment 4. As shown in FIG. 20, the chutes 121 are extended to the connecting positions of the fixed ends.

In the embodiment, the hinge connection between the bridges and the brackets and the hinge connection between the bridges can be conducted through screws or rivets; the screws can be locked in the screwing mode after locking the PCB, and the stability of the screws can be improved; and the connecting reliability can be improved by using the rivets.

Embodiment 8

Figure 21:
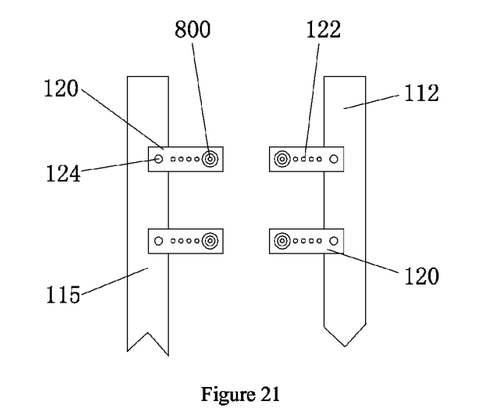
FIG. 21 is a structure form of embodiment 8 of the present invention.
Figure 22:
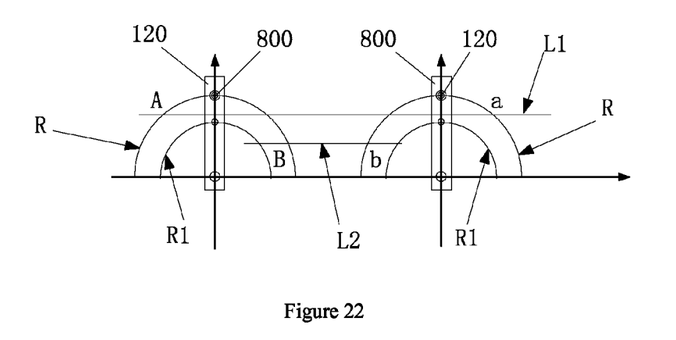
FIG. 22 is a track analysis diagram of the hillocks of embodiment 8 of the present invention.

FIG. 21 shows embodiment 8 of the present invention. Embodiment 8 is different from embodiment 7 in that: the bridges 120 are provided with through holes 122 which are provided with hillocks 800 existing as independent parts, and the hillocks 800 are arranged in the through holes 122 in the corresponding positions as required. FIG. 22 is an analysis diagram of the mobile positions of the hillocks 800. Each circular arc R in the figure indicates the mobile track of a hillock 800 in a through hole 122 of a certain position; the circular arc R1 indicates the mobile track of a hillock 800 in a through hole 122 of another position; in a similar way, different mobile tracks will be generated when the hillocks 800 are in the through holes 122 of different positions. Thus, by arranging the through holes 122 in the bridges 120, larger mobile tracks of the hillocks 800 can also be obtained, namely the corresponding rotating positions of the bridges 120 and the positions and the number of the through holes 122 are set according to PCBs of different size so that the mobile tracks of the hillocks 800 cover the locking points of various PCBs. Thus, the backplane can be adapted for PCBs of different size.

Figure 23:
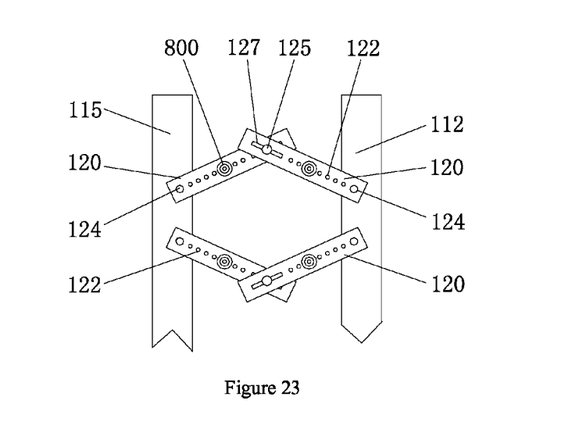
FIG. 23 is another structure form of embodiment 8 of the present invention.
Figure 24:
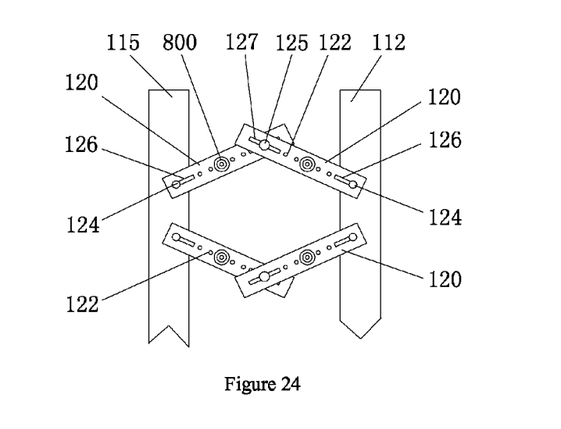
FIG. 24 is a third structure form of embodiment 8 of the present invention.

As shown in FIG. 23, the same as embodiment 7, to improve the supporting strength of the bridges 120, the free ends of two opposite bridges 120 are connected and connecting grooves 127 are arranged for installing the tail hinges 125 so that the bridges still can rotate. As shown in FIG. 24, the end hinges 124 of the fixed ends can also be provided with corresponding installing cross grooves 126 so that the bridges can slide relative to the end hinges to obtain preferable mobile ranges of the hillocks.

In the embodiment, the hinge connection between the bridges and the brackets and the hinge connection between the bridges can be conducted through screws or rivets; the screws can be locked in the screwing mode after locking the PCB, and the stability of the screws can be improved; and the connecting reliability can be improved by using the rivets.

The present invention is described in detail in accordance with the above contents with the specific preferred embodiments. However, this invention is not limited to the specific embodiments.

For the ordinary technical personnel of the technical field of the present invention, on the premise of keeping the conception of the present invention, the technical personnel can also make simple deductions or replacements, and all of which should be considered to belong to the protection scope of the present invention.

We claim:

1. A backlight module, comprising a backplane, a PCB and hillock(s); the hillock is provided with a PCB mounting hole for fixing the PCB, and the bottom of the hillock is provided with a fixed structure for arranging the hillock on the backplane; the backplane is provided with a hillock mounting hole for fixing the hillock; the hillock is arranged on the backplane by the hillock mounting hole, and the PCB is fixed on the hillock, wherein said hillock is provided with a threaded hole penetrating through the hillock, and said PCB and said hillock are fixed on the backplane by a screw.

* * * * *